United States Patent
Itzler

(10) Patent No.: US 8,193,482 B2
(45) Date of Patent: Jun. 5, 2012

(54) NEGATIVE-FEEDBACK AVALANCHE PHOTODETECTOR-BASED FOCAL-PLANE-ARRAY SENSOR

(75) Inventor: Mark Allen Itzler, Princeton, NJ (US)

(73) Assignee: Princeton Lightwave, Inc., Cranbury, NJ (US)

( * ) Notice: Subject to any disclaimer, the term of this patent is extended or adjusted under 35 U.S.C. 154(b) by 0 days.

(21) Appl. No.: 13/100,629

(22) Filed: May 4, 2011

(65) Prior Publication Data
US 2011/0204210 A1    Aug. 25, 2011

Related U.S. Application Data

(62) Division of application No. 12/178,329, filed on Jul. 23, 2008, now Pat. No. 8,026,471.

(51) Int. Cl.
*H01L 31/00* (2006.01)
(52) U.S. Cl. .......... 250/214.1; 250/214 R; 250/208.1; 257/438
(58) Field of Classification Search .......... 250/208.1, 250/214.1, 214 R, 214 DC; 257/186, 431, 257/199, 322, 438, 481, 492, 493, 551, 603, 257/E31.116, E31.063, E29.335, E21.355, 257/E21.357
See application file for complete search history.

(56) References Cited

U.S. PATENT DOCUMENTS

| | | | |
|---|---|---|---|
| 4,730,128 A * | 3/1988 | Seki | 327/513 |
| 5,763,873 A | 6/1998 | Beck et al. | |
| 6,597,110 B1 | 7/2003 | Thompson et al. | |
| 7,683,308 B2 * | 3/2010 | Charbon et al. | 250/214 R |
| 2004/0245592 A1 | 12/2004 | Harmon et al. | |
| 2004/0251483 A1 | 12/2004 | Ko et al. | |
| 2005/0012033 A1 * | 1/2005 | Stern et al. | 250/214 R |
| 2006/0108657 A1 | 5/2006 | Raynor | |

OTHER PUBLICATIONS

Legasse, Jr., Francis M., "U.S. Appl. No. 12/178,329 Notice of Allowance Jun. 3, 2011", , Publisher: USPTO, Published in: US.
Verghese et al., "Arrays of InP-based Avalanche Photodiodes for Photon Counting", "IEEE Journal of Selected Topics in Quantum Electronics", Jul./Aug. 2007, pp. 870-886, vol. 13, No. 4, Publisher: IEEE.
Aull et al, "Geiger-Mode Avalanche Photodiodes for Three-Dimensional Imaging", "Lincoln Laboratory Journal", 2002, pp. 335-350, vol. 13, No. 2.
Khodin et al, "Localised feedback in silicon-based avalanche photodiodes", "Nuclear Instruments and Methods in Physics Research Section A 513", 2003, pp. 178-182, Publisher: Elsevier B.V.
Afanasiev et al, "MRS Silicon Avalanche Detectors with Negative Feedback for Time-of-Flight Systems", "Nuclear Physics B Proceedings Supplements", 1995, pp. 402-405, Publisher: Elsevier B.V.
Shubin et al, "New avalanche device with the ability of analog few-photon pulse detection", 1995, pp. 284-293, vol. 2550, Publisher: SPIE.

(Continued)

*Primary Examiner* — Francis M Legasse, Jr.
(74) *Attorney, Agent, or Firm* — DeMont & Breyer, LLC

(57) ABSTRACT

An imaging sensor having sensitivity at the single-photon level is disclosed. The sensor comprises an array of pixels, each of which comprises a negative-feedback avalanche diode and a read-out circuit that includes a counter. The counter keeps track of the number of photons detected by the diode during a given time period.

18 Claims, 4 Drawing Sheets

OTHER PUBLICATIONS

Saveliev, Valeri, "The recent development and study of silicon photomultiplier", "Nuclear Instruments and Methods in Physics Research Section A 535", 2004, Publisher: Elsevier B.V.

Saveliev et al., "Silicon avalanche photodiodes on the base of metal-resistor-semiconductor (MRS) structures", "Nuclear Instruments and Methods in Physics Research Section A 442", 2000, pp. 223-229, Publisher: Elsevier Science B.V.

US Microwaves, "Thin Film Resistors vs Thick Film Resistors—How They Compare", "Application Note 110 http://www.usmicrowaves.com/appnotes/thin_film_resistors_versus_thick_film_resistors_how_they_compare", Jan. 8, 2009, Publisher: US Microwaves.

Yeung Lopez, Feifei, "U.S. Appl. No. 11/750,244 Notice of Allowance Feb. 23, 2010", , Publisher: USPTO, Published in: US.

Yeung Lopez, Feifei, "U.S. Appl. No. 11/750,244 Office Action Dec. 30, 2009", , Publisher: USPTO, Published in: US.

Yeung Lopez, Feifei, "U.S. Appl. No. 11/750,244 Office Action Feb. 3, 2009", , Publisher: USPTO, Published in: US.

Yeung Lopez, Feifei, "U.S. Appl. No. 11/750,244 Office Action Jul. 24, 2009", , Publisher: USPTO, Published in: US.

Yeung Lopez, Feifei, "U.S. Appl. No. 11/750,244 Restriction Requirement Sep. 5, 2008", , Publisher: USPTO, Published in: US.

Legasse, Jr., Francis M., "U.S. Appl. No. 12/178,329 Notice of Allowance Mar. 18, 2011", , Publisher: USPTO, Published in: US.

Legasse, Jr., Francis M., "U.S. Appl. No. 12/178,329 Office Action Nov. 5, 2010", , Publisher: USPTO, Published in: US.

Legasse, Jr., Francis M., "U.S. Appl. No. 12/178,329 Restriction Requirement Apr. 5, 2010", , Publisher: USPTO, Published in: US.

Legasse, Jr., Francis M., "U.S. Appl. No. 12/178,329 Restriction Requirement Jul. 23, 2010", , Publisher: USPTO, Published in: US.

* cited by examiner

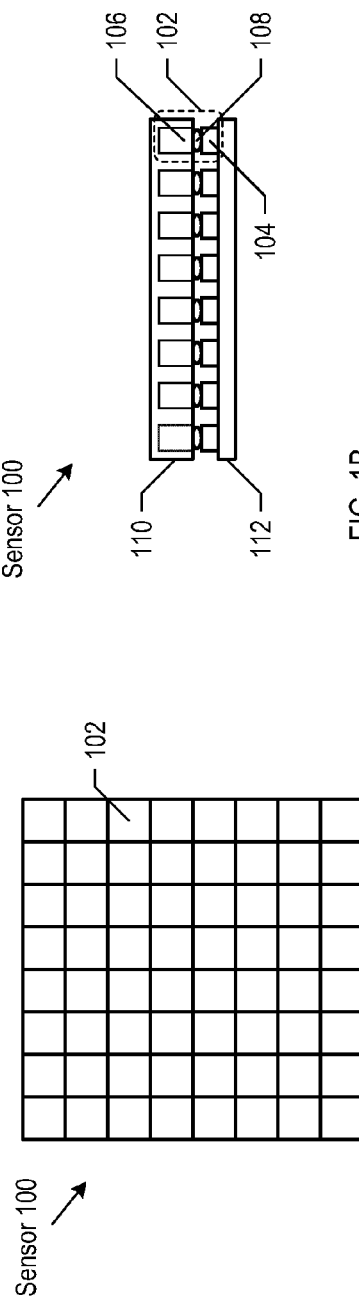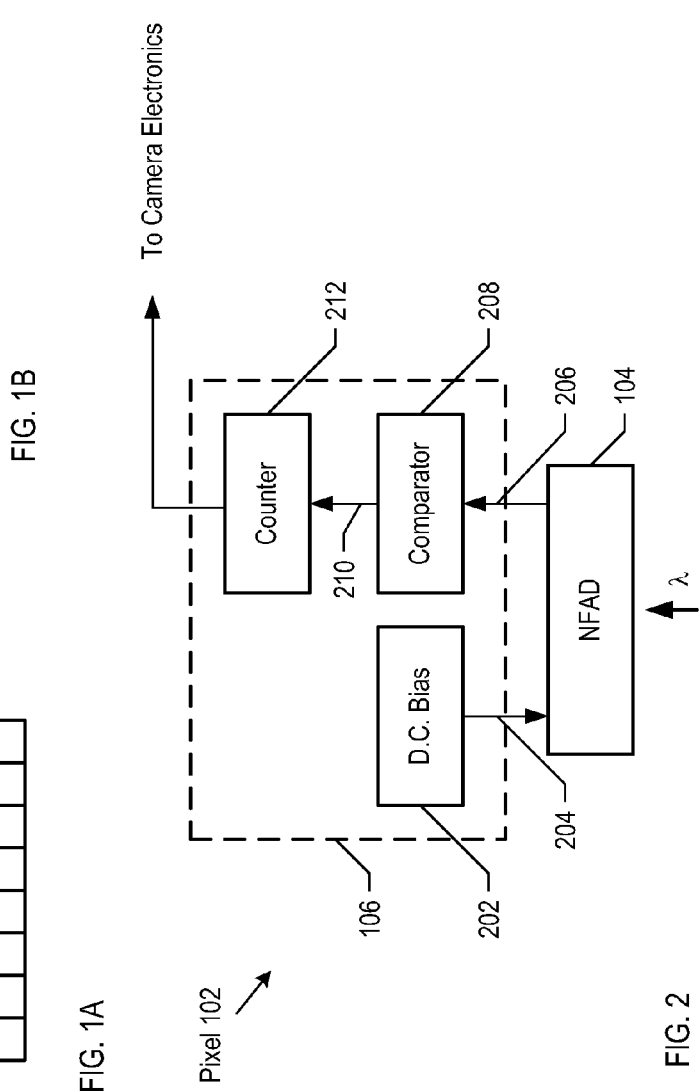

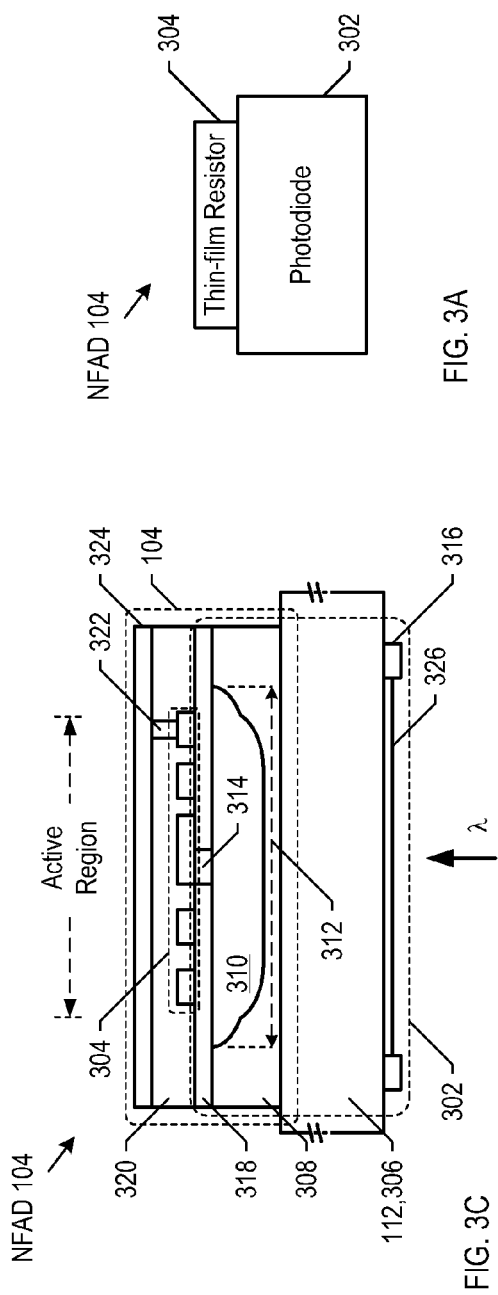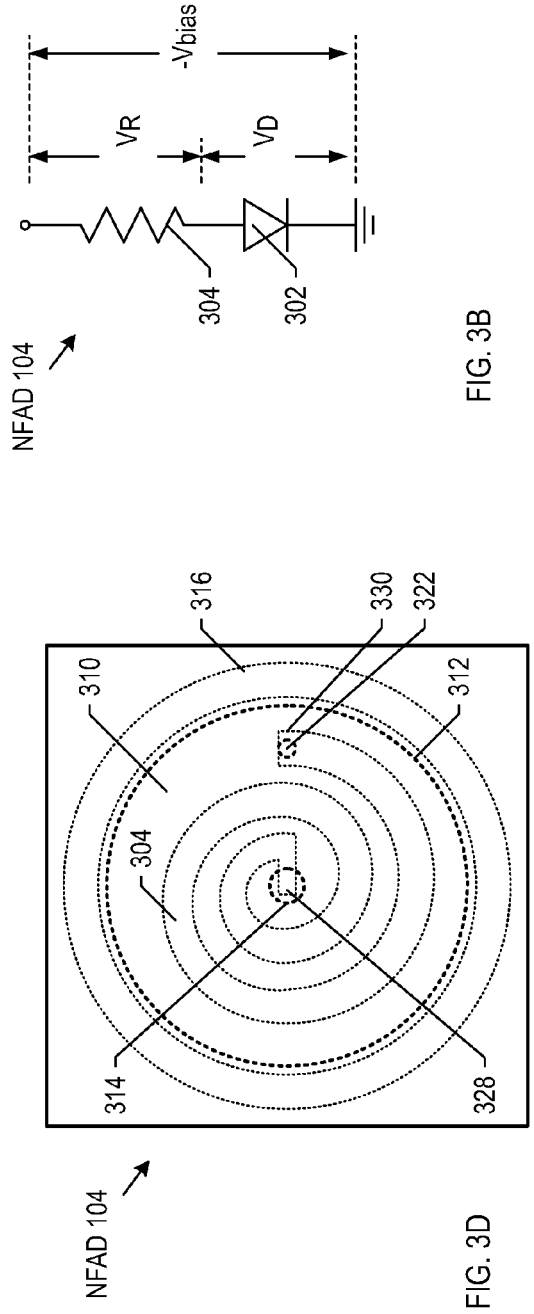

NEGATIVE-FEEDBACK AVALANCHE PHOTODETECTOR-BASED FOCAL-PLANE-ARRAY SENSOR

This case is a division of co-pending U.S. patent application Ser. No. 12/178,329 filed Jul. 23, 2008, which is incorporated by reference herein.

FIELD OF THE INVENTION

The present invention relates to imaging in general, and, more particularly, to infrared cameras.

BACKGROUND OF THE INVENTION

Vision systems have become ubiquitous in modern society. They are used in a wide array of applications including security, safety, industrial control, communications, inventory management, etc. For most applications, vision systems sensitive to visible light are sufficient. Increasingly, however, vision systems sensitive to the infrared spectrum have become desirable. Infrared visions systems are particularly attractive for applications that require imaging in low light situations (e.g., night vision systems), through foliage or other similar obstructions, and in partially obscured atmospheres such as fog- or smoke-filled air.

Some infrared cameras are sensitive to electromagnetic radiation having wavelengths in the range of 0.8 to 0.9 microns, often referred to as the "near-infrared" (NIR). Conventional NIR vision systems include traditional night vision goggles. Night vision goggles typically employ a photocathode, a microchannel plate, and a direct view phosphor to increase the intensity of low light level images. Although they can provide good low-light-level image quality, such image intensifiers are mechanically complex systems based on vacuum tube technology. In addition, image intensifiers typically only provide an ephemeral image directly on a phosphor screen and do not enable the capture of an image for storage or transmission.

At longer wavelengths of light, such as 8-10 microns (i.e., "long-wave infrared" (LWIR)), infrared cameras typically employ elements that are sensitive to energy based on the temperature of an object, such as microbolometers. A microbolometer is an extremely small heat sensor that comprises materials such as vanadium-oxide or amorphous silicon. The electrical resistance of these materials changes in response to received LWIR radiation. Microbolometers, however, exhibit self-heating effects, poor sensitivity, and generate electrical noise. Moreover, because they are sensitive only to thermal radiation, an object is detected only by the difference of its temperature from that of the background. This can result in poor image resolution.

Photodiode-based infrared cameras have been developed to overcome many of the limitations of other infrared imaging sensors. Such imaging sensors typically utilize a two-dimensional photodiode array comprising photodiodes that are sensitive to infrared radiation. Each photodiode provides an electrical signal based upon the intensity of the infrared radiation that is incident upon it. The photodiode array is electrically coupled to a read-out integrated circuit (ROIC), which includes circuitry for processing each of the electrical signals provided by the photodiode array. The photodiode array is typically disposed at the focal point of a camera lens, and the photodiode array and associated ROIC collectively define a "focal plane array (FPA)."

For imaging in the short-wave infrared (SWIR) region of the optical spectrum (i.e., 1 to 1.7 micron), photodiodes based on the InGaAsP material system have emerged as a preferred device technology. Photodetectors with a positive-intrinsic-negative (p-i-n) structure based on this material exhibit low noise at room temperature. However, for low-light-level imaging in which single photon sensitivity is the ultimate goal, existing image array pixels with state-of-the-art p-i-n detectors and amplifiers can not provide imaging with single photon sensitivity. Moreover, to obtain acceptable quality images in low-light-level conditions, these pixels must integrate photoelectrons generated by the incoming signal for fairly long periods of time (e.g., 100 ms or longer).

Almost all imagers available today are based on analog detection mechanisms. Generally, photodetectors are employed to generate photocarriers that are accumulated at the pixel level to build up an analog signal corresponding to an incident optical image. CMOS imagers and CCD imagers are examples of analog imagers. The sensitivity, or signal-to-noise ratio, of an analog pixel is degraded by both the electrical and thermal noise that originates in both its photodetector and its associated read-out electronics. Even in the absence of any input light, electrical noise is generated in the photodetector due to the shot noise associated with a continuous finite leakage current (a.k.a., dark current). The dynamic range of these imagers is also directly degraded by this leakage current.

Approaches for overcoming limitations of prior-art analog imagers include digitization of the image data at the pixel level One such approach provides digitization functionality within each pixel of the ROIC through the implementation of appropriate pixel-level circuitry, such as a sigma-delta circuit. However, this approach does not obviate the inherent analog nature of the photodetectors used with it.

Other approaches have included two-dimensional arrays of single-photon avalanche diodes (SPADs). These prior-art SPAD approaches have found limited success for low-light-level passive imaging, however. While it is relatively straightforward to initiate an avalanche event in response to a received photon, it can be difficult to stop it once it starts. SPADs are capable of generating easily detected currents by biasing the avalanche diode above its breakdown voltage. When operated in this fashion, a single photoelectron can give rise to a self-sustaining avalanche current. The utility of this current is that it is easily detectable, but following threshold detection, this current must be "actively quenched" by proactively lowering the applied voltage below the breakdown voltage. Once quenched, the device is subsequently re-armed by again raising the bias above the breakdown voltage. This sequence of "arm, avalanche, active quench, and re-arm" in SPAD operation requires appropriate pixel-level circuitry in the ROIC. Although this circuitry is considerably simpler, lower power, and more space-efficient than the circuitry required for analog pixel operation, it still adds complexity to the operation of the detector at each pixel. In addition, the response rate of such a pixel can be limited by the speed of the active electronics used to quench the photodiode.

The probability that a detection event occurs in response to a photon arrival at the detector is known as the photon detection efficiency (PDE). The probability that a detection event occurs when no photon arrives is known as the dark count probability, and the number of dark counts per second is the dark count rate (DCR). (Dark counts occur when carriers are created by processes other than photo-excitation—e.g., thermal excitation or tunneling processes—and are analogous to dark current in analog photodetectors inasmuch as the fluctuations in the DCR contribute shot noise to the overall detection process.)

While prior-art SPADs do provide single photon sensitivity, they are non-ideal with respect to other performance attributes. The avalanche process gives rise to a large number of carriers traversing the device layer where avalanche gain occurs, and some fraction of these carriers can be trapped at defects present in this layer. Gradual detrapping of these trapped carriers can lead to additional spurious detection events if the detrapping occurs when the device has re-entered its armed state. These additional spurious counts are referred to as "afterpulsing". If the device is held in its quenched state until all trapped carriers have been detrapped, then afterpulsing can be avoided. However, the introduction of a long "hold-off time" before re-arming the device limits the repetition rate at which photons can be counted. Prior art InP-based SPADs have required hold-off times on the order of 1 μs or more, limiting count rates to the order of a few MHz.

An FPA that provides single photon sensitivity with image data that is digitized at the pixel level, and that is capable of high-dynamic range video rate operation, would be an advance over the prior art.

SUMMARY OF THE INVENTION

The present invention provides an FPA suitable for infrared imaging without some of the costs and disadvantages of the prior art. In some embodiments, the present invention comprises an FPA whose pixels each comprise a negative-feedback avalanche diode (NFAD) having single-photon sensitivity and a counter that keeps track of the number of avalanche events that occur within a given time period (e.g., a video frame period).

The present invention provides image data to camera electronics, wherein the image data is quantized at the level of individual photons. As a result, the image data avoids some of the analog noise associated with prior art imaging arrays.

In contrast to prior art imagers that employ SPAD-based pixels, which require active quenching after each avalanche to rearm the SPAD to detect a subsequent photon, the present invention provides imagers comprising NFAD-based pixels. Since the negative feedback of the NFADs provides for passive quenching, no complicated active quenching circuitry is required—in fact, aside from a simple dc bias voltage, no external circuitry is required at all. In addition, the rate at which an NFAD can operate as a single-photon detector is significantly higher than that of an actively quenched SPAD.

In some embodiments, the present invention comprises an NFAD that utilizes a feedback element to quench avalanche events without the need for external quenching circuitry. In some embodiments, the feedback element is a resistor that is monolithically integrated with an avalanche photodiode. In some embodiments, the feedback element is an inductor that is monolithically integrated with an avalanche photodiode. In some embodiments, the lack of external quenching circuitry is enabled by monolithic integration of detector circuitry with the photodiode to provide negative feedback. As a result, in these embodiments the detection element array and the negative feedback elements that provide for the "arm, avalanche, quench, and re-arm" cycle of the detection elements can be monolithically integrated. In some embodiments, the photodiode array and an appropriate read-out integrated circuit are integrated in hybrid fashion through the use of solder bumps. In some embodiments, the photodiode array and the ROIC circuitry are monolithically integrated.

In some embodiments, each pixel in the image sensor comprises an NFAD that is electrically connected to a circuit cell. The circuit cell receives a current signal from the diode and develops an image data signal for that pixel based on the number of photons. During a given time period (e.g., a video frame period), each time a photon is detected at the pixel, the diode generates a current pulse. These current pulses are counted by a counter that keeps a running total of the number of current pulses received from the single-photon avalanche diode during the time period. The count of the counter, therefore, is indicative of the number of photons received at that pixel during that time period.

In some embodiments, each pixel element in the image sensor comprises a plurality of NFADs that are mutually electrically connected in parallel. Each element, therefore, outputs a current signal to read-out circuitry wherein the magnitude of the current signal is indicative of the total number of photons received by the element at a given time. This current signal is then quantized by a threshold detector whose output is provided to a counter. The counter indexes its count based upon the output of the threshold detector.

An embodiment of the present invention comprises: A sensor comprising a plurality of pixels, wherein each pixel comprises: a first photodiode, wherein the first photodiode is a single-photon avalanche diode that is physically adapted to provide a current pulse in response to a single received photon; a first negative feedback element, wherein the first negative feedback element is electrically connected in series with the first photodiode, and wherein the first photodiode and the first negative feedback element collectively define a first negative-feedback avalanche diode; and a circuit comprising a counter, wherein the circuit receives current pulses from the first photodiode and provides an output signal based on the number of current pulses received from the first photodiode within a time period.

BRIEF DESCRIPTION OF THE DRAWINGS

FIG. 1A depicts a top view of a schematic diagram of details of an imaging sensor in accordance with an illustrative embodiment of the present invention.

FIG. 1B depicts a cross-sectional view of a schematic diagram of details of an imaging sensor in accordance with the illustrative embodiment of the present invention.

FIG. 2 depicts an electrical schematic of a portion of a pixel in accordance with the illustrative embodiment of the present invention. Pixel 102 comprises NFAD 104 and circuit cell 106.

FIG. 3A depicts a schematic diagram of details of an NFAD in accordance with the illustrative embodiment of the present invention.

FIG. 3B depicts a circuit diagram of an NFAD in accordance with the illustrative embodiment of the present invention.

FIG. 3C depicts a cross-sectional view of details of an NFAD in accordance with the illustrative embodiment of the present invention.

FIG. 3D depicts a top view of details of an NFAD in accordance with the illustrative embodiment of the present invention.

DETAILED DESCRIPTION

Figure 4:
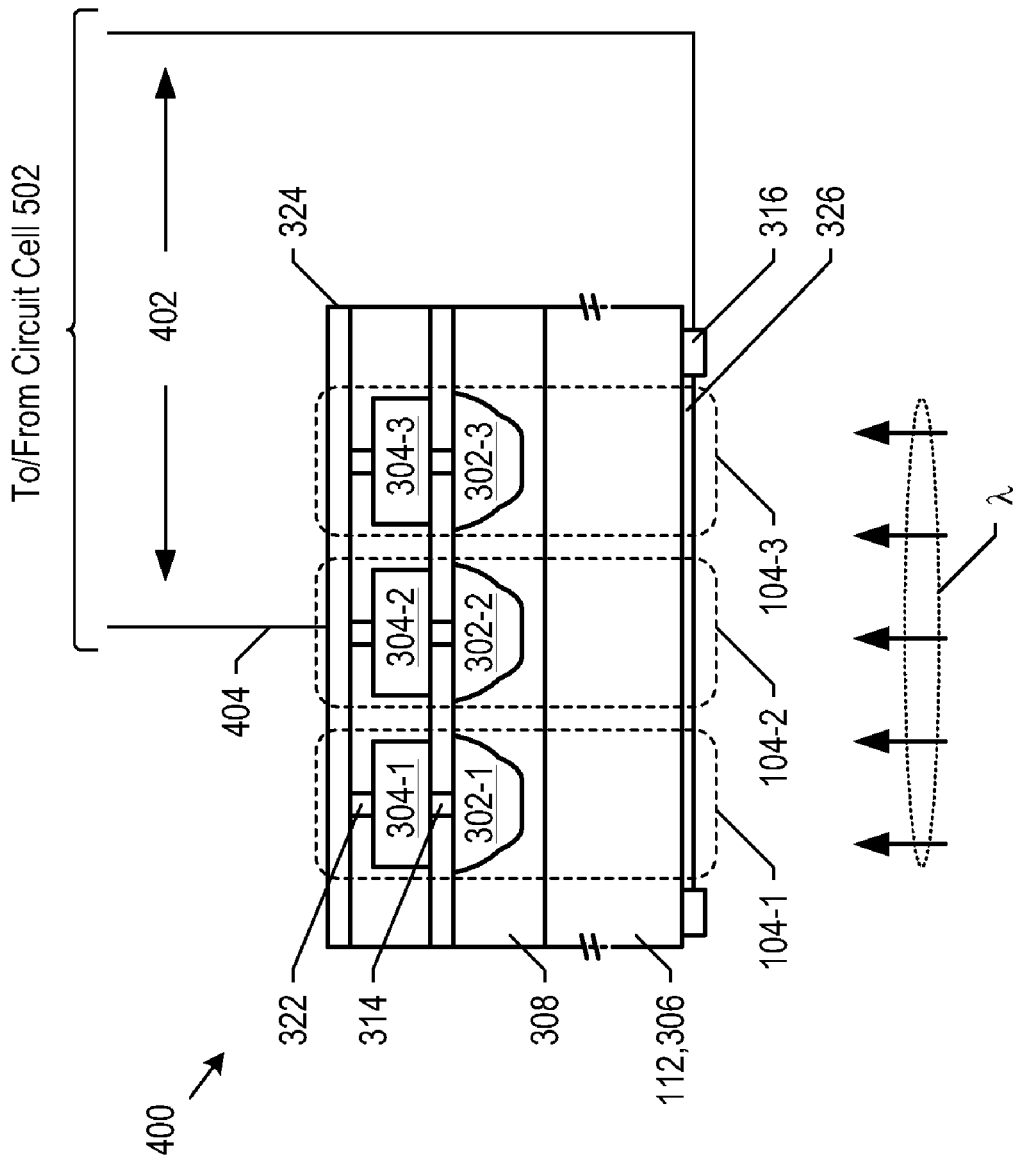
FIG. 4 depicts a cross-sectional view of details of a pixel photodetector in accordance with an alternative embodiment of the present invention.

The following terms are defined for use in this Specification, including the appended claims:

Electrically-coupled means that two elements are in either direct or indirect electrical communication. This can be via direct physical contact (e.g., a plug in an electrical outlet, etc.), via an electrically-conductive intermediate (e.g., a wire or conductive trace that interconnects the devices, etc.), or via one or more intermediate devices, etc. (e.g., resistors, capacitors, transistors, etc.).

Electrically-connected means that two elements are in direct electrical contact without any intervening devices (e.g., resistors, capacitors, transistors, etc.). In other words, the point or region of contact between the two elements remains at a substantially uniform voltage for substantially any current (i.e., the two elements are "shorted" together). For the purposes of this definition, an electrically-conductive wire or trace that serves only to interconnect the two elements is NOT considered an intervening device.

The present invention overcomes some of the limitations of the prior art by providing an FPA pixel comprising an NFAD and a counter. The counter tracks the number of photons detected by the NFAD in a given time period and provides a digital output. Specifically, the present invention utilizes an NFAD to achieve (i) independent operation of the avalanche/rearm at the detector level, without intervention from ROIC control circuitry; and (ii) a reduced carrier flow with each avalanche event. The NFAD employs the basic structure of a SPAD for single photon detection in combination with a monolithically integrated "negative feedback" element in series with the SPAD. The role of the negative feedback is to automatically quench the avalanche once it has occurred and, when appropriately implemented, to limit the total carrier flow associated with each avalanche event. With the application of a fixed dc bias above the equivalent SPAD breakdown voltage, the NFAD will automatically perform the desired avalanche/rearm cycle. An NFAD possessing these properties was disclosed in U.S. patent application Ser. No. 11/750,244, filed May 17, 2007, which is incorporated by reference herein.

The invention described in this disclosure comprises the use of an NFAD as the basic detector element in an FPA consisting of an array of NFADs hybridized to silicon ROIC electronics which count how many photons have been detected in each pixel. Because the NFAD executes the desired avalanche/rearm cycle with the application of a fixed D.C. bias, the detector bias circuitry for each ROIC pixel consists of just a D.C. voltage bias, greatly simplifying the ROIC-detector interface relative to SPAD-based FPAs and all analog FPA solutions. With the inclusion of a counter in each ROIC pixel, this NFAD FPA can provide image data at the level of single photons by counting all avalanche events that occur within a desired frame duration using a completely digital threshold detection process.

FIGS. 1A and 1B depict a top view and cross-sectional view, respectively, of a schematic diagram of details of an imaging sensor in accordance with an illustrative embodiment of the present invention. Sensor 100 comprises an 8×8 array of substantially identical pixels 102. Sensor 100 also comprises circuitry (not shown for clarity) for processing image data and providing an output video stream to suitable camera electronics. Although the illustrative embodiment comprises an 8×8 array of pixels, it will be clear to one skilled in the art, after reading this specification, how to specify, make, and use alternative embodiments of the present invention wherein an imaging sensor comprises an array of pixels of any size.

Each pixel 102 comprises a negative-feedback avalanche diode (NFAD), NFAD 104, and circuit cell 106.

NFAD 104 is suitable for operation as a detector with single photon sensitivity. NFAD 104 is electrically connected to circuit cell 106 via solder bump 108. NFADs 104 are suitable for the detection of photons having a wavelength in the infrared spectrum, and are formed on substrate 112.

Each circuit cell 106 comprises electronics suitable for providing an electrical bias to NFAD 104. In addition, each circuit cell 106 comprises electronics for receiving electrical current pulses from NFAD 104 and converting these current pulses into an electrical signal representative of the number of photons incident on that pixel.

FIG. 2 depicts an electrical schematic of a portion of a pixel in accordance with the illustrative embodiment of the present invention. Pixel 102 comprises NFAD 104 and circuit cell 106.

NFAD 104 is a negative-feedback avalanche diode (NFAD) that is suitable for detecting a single photon. As described in U.S. patent application Ser. No. 11/750,244, filed May 17, 2007, a negative feedback photodiode comprises a feedback element, such as a resistor or inductor, that limits afterpulsing effects after the receipt of a single photon. As a result, the rate at which NFAD 104 can be rearmed in preparation for receiving another photon after an avalanche event has occurred is increased. NFAD 104 is described in more detail below and with respect to FIGS. 3A-D.

D.C. Bias 202 is a circuit for applying an appropriate DC bias voltage across NFAD 104. For single-photon operation, D.C. Bias 202 biases NFAD 104 with DC bias signal 204, which is a voltage that is slightly higher than the breakdown voltage of the NFAD. As a result, the photoexcitation of a single photocarrier due to the absorption of a single photon is sufficient to induce an avalanche event. The avalanche event causes a macroscopically detectable current to flow through NFAD 104. As discussed below, and with respect to FIGS. 3A-D, this current flow is quickly quenched by the inclusion of a negative feedback element in NFAD 104.

Upon receiving a photon having a wavelength, $\lambda$, NFAD 104 provides current pulse 206 to comparator 208. Comparator 208 typically comprises a trans-impedance amplifier, reference voltage generator, and a comparator. Comparator 208 receives current pulse 206 and provides output voltage pulse 210 to counter 212. Comparator 208 is included in circuit cell 106.

Counter 212 receives voltage pulse 210 and provides a digital signal to external camera electronics (not shown). This digital signal is based on the count of counter 212 and is representative of the number of photons received by NFAD 104 within a time period (e.g., within a camera frame period). As a result, pixel 102 counts all avalanche events that occur within a desired time period and provides image data using a completely digital threshold detection process. This image data is at the single-photon resolution level.

FIG. 3A depicts a schematic diagram of details of an NFAD in accordance with the illustrative embodiment of the present invention. NFAD 104 comprises photodiode 302 and thin-film resistor 304. Photodiode 302 is an indium-phosphide-based avalanche photodetector designed for operation within the wavelength range of approximately 1000 nm to 1700 nm. Resistor 304 is a thin-film resistor that provides negative feedback to photodiode 302 to enable passive quenching of an avalanche event. In some embodiments, NFAD 104 comprises an inductor rather than resistor 304 as a feedback element. In some embodiments, NFAD 104 comprises an active feedback element such as a transistor, thyristor, silicon-controlled rectifier, and the like, as a feedback element.

FIG. 3B depicts an equivalent circuit diagram of an NFAD in accordance with the illustrative embodiment of the present invention.

In operation, a negative voltage potential, $V_{bias}$, is applied across NFAD 104, to negatively bias the NFAD and charge the capacitance associated with NFAD 104. This arms NFAD 104. To enable single-photon detection, the magnitude of $V_{bias}$ is larger than the breakdown voltage, $V_{br}$, of photodiode 302 by an excess voltage, $V_{ex}$ (i.e., $V_{bias}=V_{br}+V_{ex}$). Prior to absorbing a photon, no current flows through thin-film resistor 304; therefore, there is no voltage drop across resistor 304 and the voltage drop, $V_D$, across photodiode 302 is equal to $V_{bias}$.

Upon absorbing a photon, an avalanche current, i, will begin to build through photodiode 302 and resistor 304. As a result, a voltage drop, $V_R$, will appear across resistor 304 equal to i·R, where R is the resistance of thin-film resistor 304. Once this current reaches a magnitude where the voltage drop across resistor 304 is sufficiently close to $V_{ex}$, the remaining voltage drop across photodiode 302, $V_D$, decreases almost to the breakdown voltage $V_{br}$, at which point the avalanche current is no longer self-sustaining and quickly ceases flowing. As a result, photodiode 302 is quenched. A recharge current then flows through thin-film resistor 304 until the capacitance associated with NFAD 104 is recharged, thus reestablishing its armed state with $V_{bias}=V_{br}+V_{ex}$.

The operation rate for a SPAD is determined by the rate at which a detectable output signal is generated, the time required to quench the SPAD, the time required to allow trapped carriers to detrap and avoid afterpulsing, and the time required to rearm the SPAD after it is quenched. The speed at which a detectable output signal can be generated is quite fast for a typical SPAD. Passive quenching can also occur quite rapidly, but a large avalanche current leads to substantial carrier trapping and long detrapping times. Therefore, typical SPAD repetition rates are dominated by long hold-off times required to avoid afterpulsing. In contrast, a properly designed NFAD will exhibit very little avalanche current with negligible carrier trapping and associated afterpulsing. As a result, the operational rate for NFAD 104 is dominated by the time required to rearm the device. This time is determined primarily by the RC time constant associated with NFAD 104 during the period in which it is rearming. As discussed in more detail below, and with respect to FIGS. 3C and 3D, while rearming, this RC time constant is nominally given by the product of the resistance of feedback thin-film resistor 304 and the capacitance of photodiode 302. However, the effective capacitance that contributes to this RC time constant will also include any additional capacitance associated with thin-film resistor 304 that is electrically in parallel with the photodiode 302. It is preferable, therefore, that thin-film resistor 304 be monolithically integrated with photodiode 302 so that little, if any, capacitance associated with thin-film resistor 304 adds in parallel with the capacitance of photodiode 302 during the rearming period.

FIGS. 3C and 3D depict a cross-sectional view and top view (respectively) of details of an NFAD in accordance with the illustrative embodiment of the present invention. NFAD 104 comprises photodiode 302 and thin-film resistor 304, which is monolithically integrated above photodiode 302, as depicted in FIG. 3A. Photodiode 302 comprises semiconductor layer 306, cap layer 308, doped region 310, upper contact 314 and lower contact 316. In some embodiments, photodiode 302 is operable for photons having wavelengths within the range of approximately 1000 nm to approximately 3000 nm. It will be understood by those of ordinary skill in the art that the specific wavelength range for which photodiode 302 is operable is a function of the III-V or II-VI semiconductor material system on which the photodiode is based.

Semiconductor layer 306 comprises a plurality of layers that form the structure that underlies the cap layer 308 of an avalanche photodetector. It will be clear to those of ordinary skill in the art, after reading this specification, how to make and use semiconductor layer 306 in a manner suitable for an avalanche photodiode operable for photons having a wavelength within the desired range of wavelengths. In some embodiments, semiconductor layer 306 comprises a field control layer disposed on a charge grading layer disposed on an absorption layer disposed on a buffer layer disposed on a semiconductor substrate. In some embodiments, some or all of these layers will be doped with either n-type or p-type dopants. In some embodiments, some or all of these layers will comprise a III-V compound semiconductor or a II-VI compound semiconductor. In some embodiments, some of the plurality of layers included in semiconductor layer 306 are etched to form NFAD 104 as a mesa structure. Semiconductors suitable for use in any or all of the sub-layers of semiconductor layer 306 include, without limitation, gallium arsenide (GaAs), InP, indium-gallium-arsenide (InGaAs), aluminum-gallium-arsenide (AlGaAs), indium-aluminum-gallium-arsenide (InAlGaAs), indium-gallium-arsenide-phosphide (InGaAsP), cadmium-telluride (CdTe), mercury-cadmium-telluride (HgCdTe), and the like. Typically, the sub-layers of semiconductor layer 306 are epitaxially-grown on a III-V or II-VI semiconductor substrate. It will be clear to one of ordinary skill in the art, after reading this specification, how to select, make, and use semiconductors that are suitable for fabrication of a SPAD that operates at a wavelength greater than 1000 nm.

Cap Layer 308 is a layer of InP having a thickness of approximately 3 microns. Cap layer 308 is epitaxially grown on semiconductor layer 306. Cap layer 308 is undoped (i.e., intrinsic) InP. In some embodiments, cap layer 308 is a layer of semiconductor that has been lightly doped with an n-type dopant. In some embodiments, cap layer 308 is a layer of semiconductor that has been lightly doped with a p-type dopant.

Doped region 310 is heavily doped with p-type dopant and forms a p-n junction within cap layer 308. The lateral extent of doped region 310 defines perimeter 312, which is approximately 15 microns in diameter. The doping profile of doped region 310 also defines the "active region" of photodiode 302. In some embodiments, the active region is smaller than perimeter 312. In some embodiments, perimeter 312 has a diameter within the range of approximately 1 micron to approximately 50 microns. In some embodiments, doped region 310 is a region that is heavily doped with an n-type dopant to form an $n^+$ doped region. Doped region 310 extends vertically downward into cap layer 308 but leaves a thin portion of cap layer 308 undoped. This undoped portion of cap layer 308, which lies under doped region 310, embodies the multiplication region of photodiode 302. In some embodiments of the invention, doped region 310 is created by doping the entire cap layer 308 at an earlier step in the fabrication process (e.g., during epitaxial growth) and then creating perimeter 312 by physically removing the cap layer material outside perimeter 312.

Passivation layer 318 is a layer of silicon nitride having a thickness of approximately 100 nm. It will be clear to one of ordinary skill in the art how to make and use passivation layer 318.

Top contact 314 is a layer of p-contact metallization and is electrically-connected to doped region 310. It will be clear to one of ordinary skill in the art how to make and use top contact 314. In embodiments wherein the doped region is doped to be n-type, top contact 314 is a layer of n-contact metallization. In some embodiments, the size of top contact 314 is much smaller than would normally be associated with a typical avalanche photodiode. Normally, this would be undesirable since smaller contacts exhibit larger contact resistance. In the case of the present invention, however, the contact resistance of top contact 314 simply adds to the resistance of thin-film resistor 304.

Bottom contact 316 provides a means of making electrical contact to semiconductor layers 306. It will be clear to one of ordinary skill in the art how to make and use bottom contact 316.

Anti-reflection layer 326 is a layer of material suitable for reducing the reflection of light having wavelength λ from the surface of semiconductor layer 306. It will be clear to one of ordinary skill in the art how to make and use anti-reflection layer 326.

Photodiode 302 is a complete photodiode structure and is operable as a stand-alone photodetector. In this state, it is analogous to a prior-art SPAD that operates at wavelengths greater than 1000 nm. Photodiode 302 is characterized by a capacitance, $C_p$, which is a function of its layer structure and geometry.

Thin-film resistor 304 is a thin layer of electrically conductive material and has first terminal 328 and second terminal 330. Thin-film resistor 304 is formed on passivation layer 318. Thin-film resistor 304 and top contact 314 are electrically-connected at first terminal 328. Thin-film resistor 304 is a layer of electrically conductive material that has a suitable sheet resistance (e.g., 50-5000Ω/□). This layer is patterned to form a resistor having a value of approximately 100 KΩ. In some embodiments, thin-film resistor 304 has a resistance value within the range of approximately 10 KΩ to approximately 10 MΩ. Although in the illustrative embodiment thin-film resistor 304 is patterned into a spiral shape that extends from first terminal 328 to second terminal 330 (as depicted in FIG. 2D), it will be clear to those of ordinary skill in the art, after reading this specification, how to make and use alternative embodiments of the present invention wherein thin-film resistor 304 is patterned into any suitable shape. In some embodiments, the shape of thin-film resistor defines a thin-film inductor for providing negative feedback to photodiode 302.

In some embodiments, thin-film resistor 304 is patterned using well-known "lift-off" techniques. In some embodiments, thin-film resistor 304 is patterned using full-surface deposition or selective area deposition, followed by subtractive patterning using photolithography and etching techniques. Suitable materials for use in thin-film resistor 304 include, without limitation, nickel-chrome (NiCr), tantalum nitride (TaN), niobium nitride (NbN), titanium, platinum, gold, tungsten, and the like.

The recharge time constant for NFAD 104 is approximately equal to $R \cdot C_D$, where R is the resistance of resistor 304. Since resistor 304 adds little or no capacitance to the photodetector structure, the capacitance of NFAD 104, $C_D$, remains approximately equal to the capacitance of photodiode 302, $C_p$, alone. To facilitate single-photon detection, photodiode 302 has an overall structure, including the active area diameter, which generates a capacitance, $C_p$, within the range of approximately 1 femtoFarad (fF) to approximately 250 fF. Typically, photodiode 302 has a capacitance, $C_p$, of approximately 50 fF.

Dielectric layer 320 is a layer of dielectric material having a thickness of approximately 0.2 micron. It will be clear to those of ordinary skill in the art how to select a suitable thickness and material for dielectric layer 320. Suitable materials for dielectric layer include, without limitation, nitrides of silicon, oxides of silicon, insulating polymer layers, and the like.

Via 322 is located within perimeter 312 and via 322 and thin-film resistor 304 are electrically-connected at second terminal 330. It will be clear to those of ordinary skill in the art how to make and use electrically conductive via 322.

Bond pad 324 is a region of electrically conductive material disposed on dielectric layer 320. Bond pad 324, electrically conductive via 322, thin-film resistor 304, and top contact 314 are all electrically-connected. In some embodiments, bond pad 324 extends beyond perimeter 312. In these embodiments, because the NFAD is designed to operate with a fixed DC bias applied across the series combination of resistor 304 and photodiode 302, any capacitance between contact pad 324 and cap layer 308 is charged only when the DC bias is first applied. After the application of this operating voltage, the discharging and recharging of diode 302 is not affected by parasitic capacitance associated with contact pad 324. In some embodiments, contact pad 324 does not extend beyond perimeter 312.

By virtue of its potential for high-speed operation, NFAD 104 is capable of providing dynamic range that far exceeds that of the prior art. For example, NFADs similar to NFAD 104 have been demonstrated that operate with dark count rates below 10 kHz and with photon detection efficiencies that exceed 25%. Such operation corresponds to a mean time between dark counts of 100 microseconds. Further, such NFADs are capable of photon count rates of up to 100 MHz with hold-off times of approximately 10 nanoseconds. Such NFADs are capable of a dynamic range of approximately 10,000, therefore, which represents a 10× improvement over that of prior art FPA pixels for imaging at SWIR wavelengths.

FIG. 4 depicts a cross-sectional view of details of a pixel photodetector in accordance with an alternative embodiment of the present invention. NFAD array 400 comprises NFADs 104-1, 104-2, and 104-3, each of which are analogous to NFAD 104. Each NFAD comprises a single-photon avalanche detector 302 and a negative feedback element 304. The NFADs are electrically connected in parallel so that a photon incident on any one of the NFADs results in a current pulse that is output by the NFAD array. Each NFAD operates individually, however. As a result, if two or more NFADs within the array receive photons at approximately the same time, their individual current pulses will overlap to result in a current pulse having larger amplitude.

Figure 5:
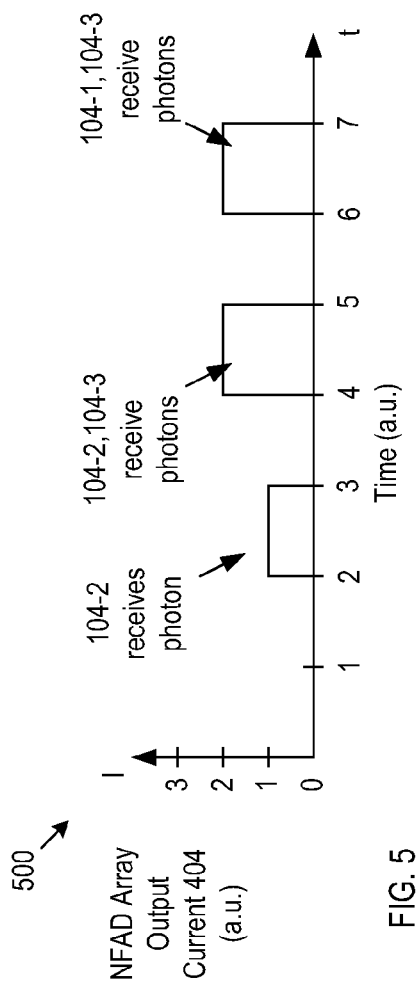
FIG. 5 depicts an example of a typical output current from an NFAD array in accordance with the alternative embodiment of the present invention.

FIG. 5 depicts an exemplary response of an NFAD array in accordance with the alternative embodiment of the present invention. Plot 500 depicts an output signal of NFAD array 400 over an arbitrary period of time wherein several photons are received by the array at different times. In this example, a photon is incident on NFAD 104-2 at time t=2. This results in a current pulse having a magnitude of 1 and a pulse width equal to one time period. At time t=4, two photons are incident on NFADs 104-2 and 104-3. As a result, the output 404 of the NFAD array is a current pulse having a magnitude of 2 (i.e., the sum of a first current pulse from NFAD 104-2 and a second current pulse from NFAD 104-3). Finally, at time t=6, two more photons are received by NFAD array 400 and are incident on NFADs 104-1 and 104-3 at time t=6. These two NFADs each output current pulses that are added to become an output current pulse having magnitude 2 and a pulse width of one time period.

Figure 6:
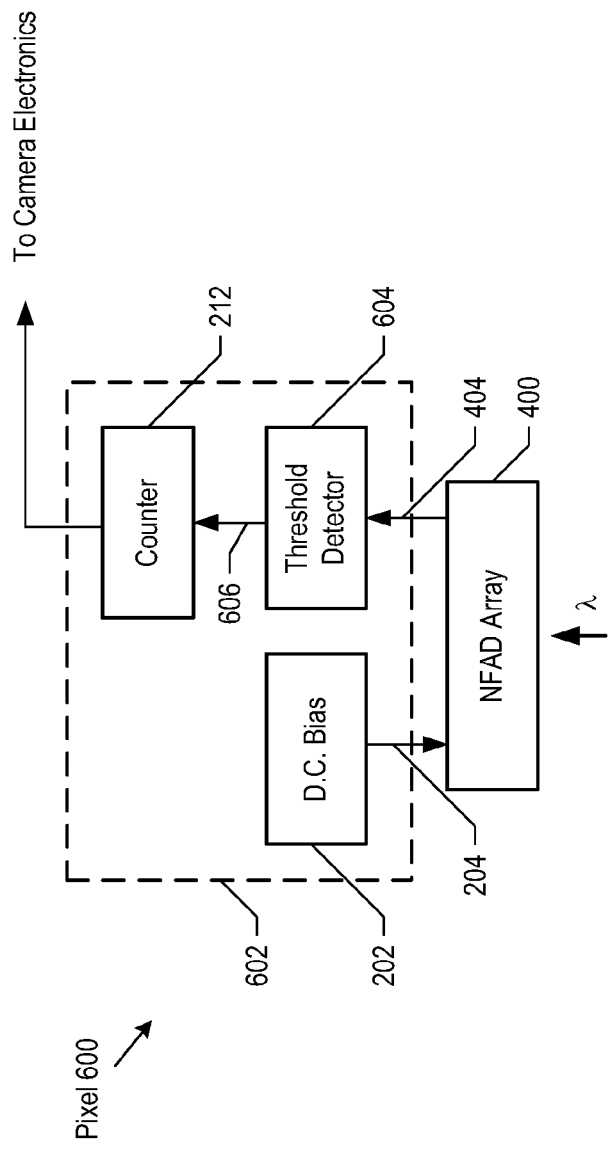
FIG. 6 depicts a circuit diagram of an FPA pixel in accordance with the alternative embodiment of the present invention.

FIG. 6 depicts a schematic diagram of details of a pixel in accordance with the alternative embodiment of the present invention. Pixel 600 comprises NFAD array 400 and circuit cell 602.

Circuit cell 602 comprises D.C. Bias 202, threshold detector 604, and counter 212.

NFAD array 400 provides output current signal 404 to threshold detector 604. Threshold detector 604 provides quantized output 606 based on the magnitude of current signal 404. Counter 212 receives output 606 and indexes its count based on its quantized value.

The value of counter 212 is reset at the start of each video frame. In some embodiments, the camera electronics provides the reset signal. In some embodiments, circuit cell 602 includes timing circuitry.

It should be noted that the alternative embodiment depicted in FIGS. 4-6 is enabled by the fact that the photodiodes are NFADs. By virtue of the negative feedback element inherent in an NFAD, the amount of charge generated per unit time during each avalanche event is limited in amount. Further, the amount of charge generated during each avalanche event is substantially consistent from avalanche event to avalanche event. In other words, an NFAD will produce a substantially uniform "packet" of charge each time it detects an incident photon. As a result, an array of NFADs that are electrically connected in parallel, such as is depicted in FIG. 4, generates a total output signal whose amplitude is well-correlated with the number of NFADs that are simultaneously responding to received photons. Such an array produces an output that is "quantized" at the single photon level.

The uniform responsivity of an NFAD to each incident photon is in marked contrast to the response of a conventional SPAD. A SPAD provides a macroscopic current pulse each time it responds to an incident photon. The intrinsic avalanche process of a SPAD, however, is characterized by a positive feedback mechanism that creates large fluctuations in the amount of charge generated per unit time. The total charge that flows from a single SPAD from one avalanche to the next, therefore, can vary significantly. As a result, an array of SPADs that are electrically connected in parallel would generate a total output signal whose amplitude was only weakly correlated with how many of the SPADs had received a photon.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A sensor comprising a plurality of pixels, wherein each pixel comprises:
a plurality of negative-feedback avalanche photodiodes, wherein the plurality of negative-feedback avalanche photodiodes are electrically connected in parallel, wherein each negative-feedback avalanche photodiode comprises (1) a photodiode that is physically adapted to enable detection of a single photon and (2) a feedback element that is physically adapted to limit afterpulsing in the photodiode, and wherein the photodiode and feedback element are monolithically integrated; and
a circuit comprising a counter, wherein the circuit receives current pulses from the plurality of negative-feedback avalanche photodiodes and provides a first output signal that is based on the number of current pulses received from the plurality of negative-feedback avalanche photodiodes within a time period.

2. The sensor of claim 1 wherein the circuit further comprises a threshold detector, wherein the threshold detector provides a second output signal that is based on a first current whose magnitude is based on the number of the current pulses simultaneously received from the plurality of negative-feedback avalanche photodiodes.

3. The sensor of claim 2 wherein the second output signal is a quantized signal whose number of quantization levels is based on the number of negative-feedback avalanche photodiodes in the plurality of negative-feedback avalanche photodiodes.

4. The sensor of claim 2 wherein the second output signal is a quantized signal, and wherein the counter indexes its count based on the quantized value of the second output signal.

5. The sensor of claim 2 wherein the plurality of negative-feedback avalanche photodiodes comprises a first negative-feedback avalanche photodiode that comprises:
a first photodiode, the first photodiode being dimensioned and arranged to provide a current pulse in response to a single received photon; and
a first negative-feedback element, the first negative feedback element being electrically connected in series with the first photodiode.

6. The sensor of claim 5 wherein the first negative feedback element comprises a thin-film resistor.

7. The sensor of claim 5 wherein the first negative feedback element comprises a thin-film inductor.

8. A sensor comprising a plurality of pixels, wherein each pixel comprises:
(1) a first negative-feedback avalanche photodiode that is dimensioned and arranged to provide a current pulse to a first terminal in response to a single received photon, the first negative-feedback avalanche photodiode comprising;
(a) a first photodiode; and
(b) a first negative-feedback element, the first negative-feedback element being electrically connected in series between the first photodiode and the first terminal, and the first negative-feedback element being physically adapted to limit afterpulsing in the first photodiode, wherein the first photodiode and first feedback element are monolithically integrated;
(2) a second negative-feedback avalanche photodiode that is dimensioned and arranged to provide a current pulse to the first terminal in response to a single received photon, the second negative-feedback avalanche photodiode comprising;
(a) a second photodiode; and
(b) a second negative-feedback element, the second negative-feedback element being electrically connected in series between the second photodiode and the first terminal, and the second negative-feedback element being physically adapted to limit afterpulsing in the second photodiode, wherein the second photodiode and second feedback element are monolithically integrated; and
(3) a circuit comprising a counter that provides a first electrical signal based on the number of current pulses received at the first terminal within a time period.

9. The sensor of claim 8 wherein the circuit further comprises a threshold detector, wherein the threshold detector provides a second electrical signal that is based on a first current whose magnitude is based on the number of the current pulses simultaneously received at the first terminal.

10. The sensor of claim 9 wherein the second electrical signal is a quantized signal whose number of quantization levels is based on the number of negative-feedback avalanche photodiodes in the plurality of negative-feedback avalanche photodiodes.

11. The sensor of claim 9 wherein the second electrical signal is a quantized signal, and wherein the counter indexes its count based on the quantized value of the second electrical signal.

12. A method for determining the intensity of a light signal that is incident on a pixel, wherein the method comprises:
  receiving a first photon of the light signal at one of a plurality of negative-feedback avalanche photodiodes that are electrically connected in parallel, wherein each of the plurality of negative-feedback avalanche photodiodes is dimensioned and arranged to generate a current pulse in response to the receipt of a single photon, and wherein each of the plurality of negative-feedback avalanche photodiodes comprises a feedback element that is physically adapted to limit afterpulsing in the photodiode, the photodiode and feedback element being monolithically integrated, and further wherein the pixel comprises the plurality of negative-feedback avalanche photodiodes;
  generating a first current pulse in response to the received first photon;
  providing the first current pulse to a circuit comprising a counter whose count is based on the number of current pulses the counter receives within a time period; and
  increasing the count of the counter.

13. The method of claim 12 further comprising resetting the count of the counter at the start of a time period.

14. The method of claim 12 further comprising:
  receiving a second photon of the light signal at one of the plurality of negative-feedback avalanche photodiodes;
  generating a second current pulse in response to the received second photon;
  providing the second current pulse to the circuit; and
  increasing the count of the counter.

15. The method of claim 14 wherein the first photon is received at a first one of the plurality of negative-feedback avalanche photodiodes and the second photon is received at a second one of the plurality of negative-feedback avalanche photodiodes.

16. The method of claim 15 further comprising:
  generating a first electrical signal, wherein the first electrical signal is generated by a threshold detector that receives a first current having a magnitude that is substantially equal to the combined magnitude of the first current pulse and the second current pulse, and wherein the first electrical signal is based on the magnitude of the first current; and
  providing the first electrical signal to the counter; and
  increasing the count of the counter by an increment that is based on the first electrical signal.

17. The method of claim 16 wherein the threshold detector provides the first electrical signal as a quantized signal.

18. The method of claim 16 wherein the threshold detector provides the first electrical signal as a quantized signal whose number of quantization levels is based on the number of negative-feedback avalanche photodiodes in the plurality of negative-feedback avalanche photodiodes.

* * * * *